United States Patent [19]
Huang et al.

[11] Patent Number: 6,072,824
[45] Date of Patent: Jun. 6, 2000

[54] CIRCUIT ARRANGEMENT FOR REDUCING INTERMODULATION IN A BANDPASS FILTER SYSTEM

[75] Inventors: Guanghua Huang; Markku Harkonen, both of Hutchinson, Minn.

[73] Assignee: ADC Solitra, Inc., Hutchinson, Minn.

[21] Appl. No.: 09/012,755

[22] Filed: Jan. 23, 1998

[51] Int. Cl.$^7$ .................................................. H04B 1/38
[52] U.S. Cl. ...................... 375/219; 330/107; 330/124; 330/132; 330/149; 370/278; 370/349; 375/346; 455/266; 455/327; 455/295
[58] Field of Search .............. 375/219; 455/295

[56] References Cited

U.S. PATENT DOCUMENTS

| | | | |
|---|---|---|---|
| 4,217,554 | 8/1980 | Brzozowski | 330/124 R |
| 4,691,376 | 9/1987 | Watanabe et al. | 455/131 |
| 5,023,866 | 6/1991 | DeMuro | 370/278 |
| 5,127,102 | 6/1992 | Russell | 455/327 |
| 5,222,255 | 6/1993 | Kuo et al. | 455/266 |
| 5,237,288 | 8/1993 | Cleveland | 330/107 |
| 5,302,958 | 4/1994 | Roberts et al. | 342/157 |
| 5,406,588 | 4/1995 | Birchler et al. | 375/346 |
| 5,534,820 | 7/1996 | Tupper et al. | 330/149 |
| 5,657,326 | 8/1997 | Burns et al. | 370/349 |
| 5,657,344 | 8/1997 | Na | 375/219 |
| 5,694,082 | 12/1997 | Schmidt | 330/132 |
| 5,977,835 | 11/1999 | Huang | 330/305 |

FOREIGN PATENT DOCUMENTS

| | | | |
|---|---|---|---|
| 0 495 598 A1 | 7/1992 | European Pat. Off. | H03D 9/06 |
| 43 29 693 A1 | 3/1994 | Germany | H03D 7/16 |
| 03085910 | 4/1991 | Japan | H03F 3/60 |
| 2 223 146 | 3/1990 | United Kingdom | H04B 1/10 |

*Primary Examiner*—Stephen Chin
*Assistant Examiner*—Paul N. Rupert
*Attorney, Agent, or Firm*—Merchant & Gould P.C.

[57] ABSTRACT

A circuit arrangement that reduces selected intermodulation. The circuit arrangement includes a signal amplifier coupled to a bandpass filter via an electrical path. Signal energy outside the passband is reflected back into the amplifier and causes intermodulation. The electrical path is constructed with a length that reduces intermodulation, where the length is an odd multiple of one-fourth the wavelength of a predetermined frequency in the passband. The length of the electrical path reduces intermodulation because certain signals reflected by the bandpass filter are approximately 180°, or an odd multiple thereof, out of phase. Energy of problematic signals that are near the edge of the passband or in the stopband is reduced, such as third order intermodulation product and pairs of signals that produce third order intermodulation products.

9 Claims, 5 Drawing Sheets

CIRCUIT ARRANGEMENT FOR REDUCING INTERMODULATION IN A BANDPASS FILTER SYSTEM

FIELD OF THE INVENTION

The present invention relates generally to radio wave filtering circuit arrangements, and more particularly to reducing intermodulation in such filter arrangements.

BACKGROUND

Radio frequency (RF) equipment uses a variety of approaches and structures for receiving and transmitting radio waves in selected frequency bands. Typically, filtering structures are used to maintain proper communication in frequency bands assigned to a particular band. The type of filtering structure used often depends upon the intended use and the specifications for the radio equipment. For example, dielectric and coaxial cavity resonator filters are often used for filtering electromagnetic energy in certain frequency bands, such as those used for cellular and PCS communications.

With today's radio signal systems, intermodulation performance is becoming increasingly significant. The air is filled with radio waves from a myriad of sources, including cellular telephones, radio stations, radar systems, and satellites. Viewed simply, intermodulation results in undesired radio signals that interfere with desired radio signals. Sometimes desired radio signals combine to create intermodulation. An example serves to illustrate the problem created by intermodulation.

An example radio receiver includes a bandpass filter and a low noise amplifier to provide as output a desired frequency range of radio signals, such as, 898.2 MHz–900.8 MHz. Thus, radio signals outside the range, or "passband," are filtered out of the radio signal. Often, however, two radio signals whose frequencies are close to the passband are captured by the receiver. Two example signals have frequencies of 896 MHz and 897 MHz. It will be appreciated that the signals having frequencies of 896 MHz and 897 MHz are outside the passband. However, the two signals combine to produce third order intermodulation signals having frequencies of 895 MHz and 898 MHz. The 895 MHz signal falls outside the passband, and the 898 MHz signal falls at the edge of the passband. It will be appreciated that other pairs of signals may produce third order intermodulation signals that are within the passband.

At low power levels, intermodulation may not present an interference problem. However, when power is increased, the level of the third order intermodulation signals increases at a rate three-times that of the first order signals. Thus, if increased power results in the 896 MHz and 897 MHz first order signals being increased by 1 dB, the 898 MHz third order signal increases by 3 dB.

A prior approach for reducing intermodulation increases the bias current to the amplifier. For example, a transistor capable of handling a higher power level is used. However, such transistors are generally more susceptible to noise and require a high bias current. A problem with such approaches is that certain applications, such as Coded Division Multi-Access (CDMA) cellular telephone systems, require very low noise and low bias current.

Therefore, while other designs may effectively address intermodulation for certain classes of radio receiver applications, they lack general applicability. A circuit arrangement that addresses the above identified problems would therefore be desirable.

SUMMARY OF THE INVENTION

According to one embodiment, the present invention is directed to a circuit arrangement for reducing intermodulation. The circuit arrangement comprises: a signal amplifier having an output port; a bandpass filter having a passband ranging from a first frequency to a second frequency; an electrical path constructed to couple the output port of the amplifier to the bandpass filter, and having a length that is an odd multiple of one-fourth a wavelength of a predetermined frequency in the passband.

In another embodiment, a radio signal receiver circuit arrangement is provided. The receiver arrangement comprises: an antenna; a signal amplifier coupled to the antenna and having an output port; a bandpass filter having a passband ranging from a first frequency to a second frequency; an electrical path constructed to couple the output port of the amplifier to the bandpass filter, and having a length that is an odd multiple of one-fourth a wavelength of a predetermined frequency in the passband; a voltage controlled oscillator; a mixer coupled to the bandpass filter and to the voltage controlled oscillator, and arranged to provide an intermediate frequency; and an intermediate frequency amplifier coupled to the mixer.

In a third embodiment, a radio signal transceiver arrangement is provided. The arrangement comprises an antenna; a duplexer coupled to the antenna; a first signal amplifier coupled to the antenna and having an output port; a bandpass filter having a passband ranging from a first frequency to a second frequency; an electrical path constructed to couple the output port of the first amplifier to the bandpass filter, and having a length that is an odd multiple of one-fourth a wavelength of a predetermined frequency in the passband; a voltage controlled oscillator; a mixer coupled to the bandpass filter and to the voltage controlled oscillator, and arranged to provide an intermediate frequency; an intermediate frequency amplifier coupled to the mixer; and a transmit signal amplifier coupled to the duplexer and voltage controlled oscillator and arranged to provide amplified signals for transmission.

A method for reducing intermodulation in a filter circuit arrangement is another aspect of the invention. The method comprises the steps of: providing a signal amplifier; providing a bandpass filter, the bandpass filter having a passband ranging from a first frequency to a second frequency; establishing a signal path from the signal amplifier to the bandpass filter, the signal path having a length that is an odd multiple of one-fourth a wavelength of a predetermined frequency in the passband.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon reading the following detailed description and upon reference to the drawings in which.

Figure 1:
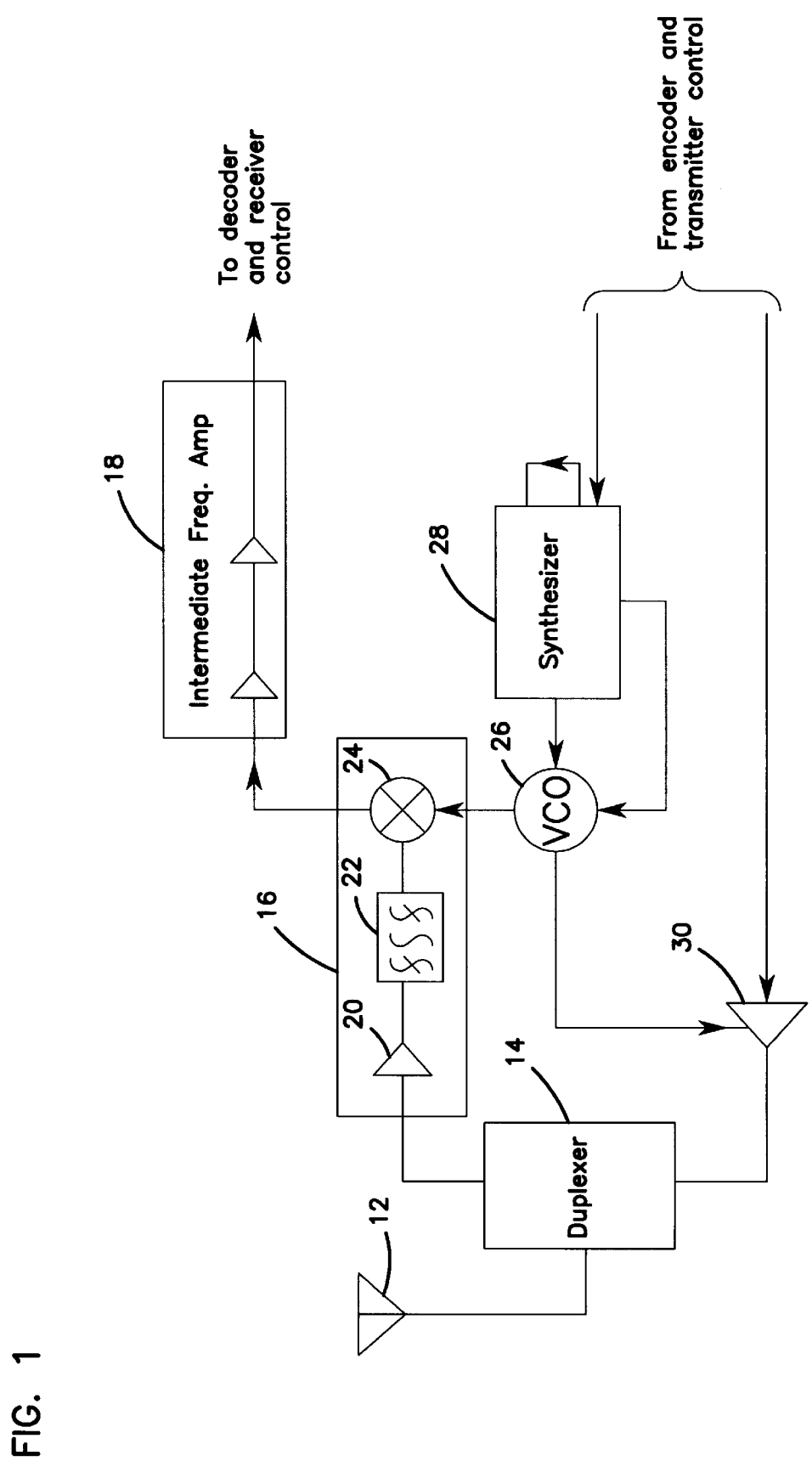
FIG. 1 is a block diagram of a circuit arrangement providing duplexed reception and transmission of radio signals in accordance with the present invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of radio frequency (RF) applications in which reducing intermodulation is desirable. The present invention has been found to be particularly applicable and beneficial in cellular-communication applications. While the present invention is not so limited, an appreciation of the present invention is best presented by way of a particular example application, in this instance, in the context of cellular communication.

FIG. 1 is a block diagram of an example circuit arrangement, according to one implementation and application of the present invention, providing duplexed reception and transmission of radio signals. The system of FIG. 1 includes both receive and transmit circuitry for use in various communication arrangements, such as a cellular telephone arrangement. It will be appreciated that the receive circuitry of FIG. 1 is suitable for both mobile and base portions of an example cellular telephone arrangement. Other embodiments of the invention are also suitable for use in various other systems having only receive circuitry, such as satellite receivers.

The arrangement of FIG. 1 includes an antenna 12 coupled to a duplexer 14. Receive circuitry includes a converter 16, implemented in a manner consistent with FIG. 2, coupled to receive radio signals from duplexer 14 and an intermediate frequency amplifier 18 coupled to the output of converter 16. Intermediate frequency amplifier provides as output amplified signals having a predetermined frequency.

Converter 16 includes a low-noise amplifier 20 that receives input radio signals from duplexer 14. The amplified signals are provided to bandpass filter 22, and the remaining signals are input to mixer 24. Mixer 24 receives the input radio signals and signals from voltage controlled oscillator 26, and provides signals having an intermediate frequency to amplifier 18. Voltage controlled oscillator 26 receives signals from synthesizer 28, which, for example, includes a phase-locked loop to lock a desired frequency.

Transmit circuitry includes, in brief, an amplifier that receives signals for transmission, along with signals from voltage controlled oscillator 26. The output of amplifier 30 is provided to duplexer 14. While only an amplifier is shown, it will be recognized that typical transmit circuitry conventionally includes additional mixers, amplifiers, and filters to suit a particular application.

Figure 2:
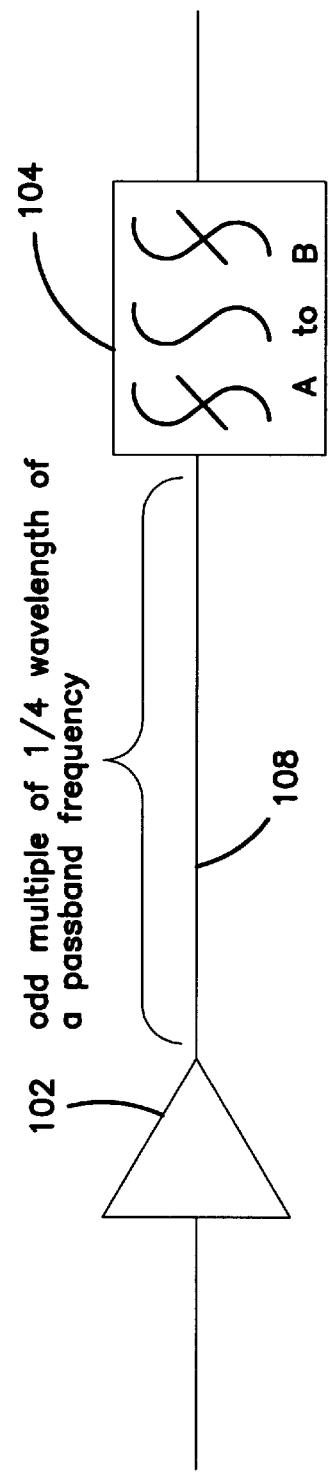
FIG. 2 illustrates an example circuit arrangement according to an embodiment of the present invention.

FIG. 2 illustrates an example circuit arrangement according to an example embodiment of the present invention. The example filter arrangement can be used, for example, in the receive circuit illustrated in FIG. 1. Specifically, The filter arrangement includes a low-noise amplifier 102 and a bandpass filter 104. Amplifier 102 is selected according to system requirements for signal amplification, such as, for example a low-noise amplifier. Filter 104 is a bandpass filter that is coupled to low-noise amplifier 102 via electrical path 108. Electrical path 108 is, for example, a cable, a metallic trace on a printed circuit board or another suitable medium. An example bandpass filter 104 is the GMF 91107 filter that is commercially available from ADC SOLITRA.

In a typical low noise amplifier/bandpass filter system, some radio wave energy at the stopband and at the edge of the passband is reflected from the bandpass filter and back into the low noise amplifier, thereby degrading intermodulation performance.

To reduce or eliminate such intermodulation problems, especially those near the edges of the passband of a bandpass filter, the length of electrical path 108 is constructed to cancel or reduce the energy of signals reflected from bandpass filter 104. Specifically, the length of electrical path 108 is constructed to be ¼, or an odd multiple thereof, the wavelength of a selected frequency. This particular length results in reflected signals having a voltage phase difference of 90° from those output from the low noise amplifier 102. In terms of energy (i.e., voltage * current), the reflected signals have an energy level that is 180° out of phase from those output from the low noise amplifier 102. Thus, the electrical path is sometimes referred to as a "180° path." It will be appreciated that the electrical path lengths that are odd multiples of 180°, or stated differently, odd multiples of ¼ the wavelength of the selected frequency, will also function in accordance with the present invention. Hereinafter a "180° path" is assumed to refer to electrical paths having lengths that are odd multiples of 180°.

In the example embodiment, the selected frequency is approximately the center frequency of the passband. For example, if the bandpass filter has a passband ranging from A MHz to B MHz, the center frequency is (A MHz+B MHz)/2. The selected frequency from which the desired length of the electrical path is determined does not have to be precisely the center frequency of the passband. That is, comparable results can be achieved with other frequencies within the passband.

As the following example will illustrate, selection of the length of the electrical path as a function of a frequency within the passband reduces intermodulation. It is recognized that the energy of signals within the passband is not reflected by a bandpass filter. Thus, if the length of the electrical path is determined according to a selected frequency within the passband, the energy of such signal will not be reflected back into the low noise amplifier. Stated differently, third order intermodulation signals that fall in the passband are not reflected. However, when the length of the electrical path is determined according to the selected frequency within the passband, the energy is reduced for signals near the edge of the passband. Thus, the energy is reduced for a pair of signals near the edge of the passband that combine to produce a third order intermodulation signal in the passband. Thus, by reducing the energy of the pair of signals that produce the third order intermodulation signal, the energy of the third order intermodulation signal is reduced. It will be also be appreciated that the energy is reduced for third order intermodulation signals that are near the edge of the passband.

The actual physical length of electrical path 108 is a function of the computed wavelength and the dielectric constant associated with the desired medium. As recognized, $\lambda_p=\lambda/\text{SQRT}(\xi)$, where $\lambda_p$ is the physical wavelength for a particular medium, $\lambda$ is the computed wavelength for a signal of the selected frequency, and $\text{SQRT}(\xi)$ is the square-root of the dielectric constant for the medium.

Figure 3:
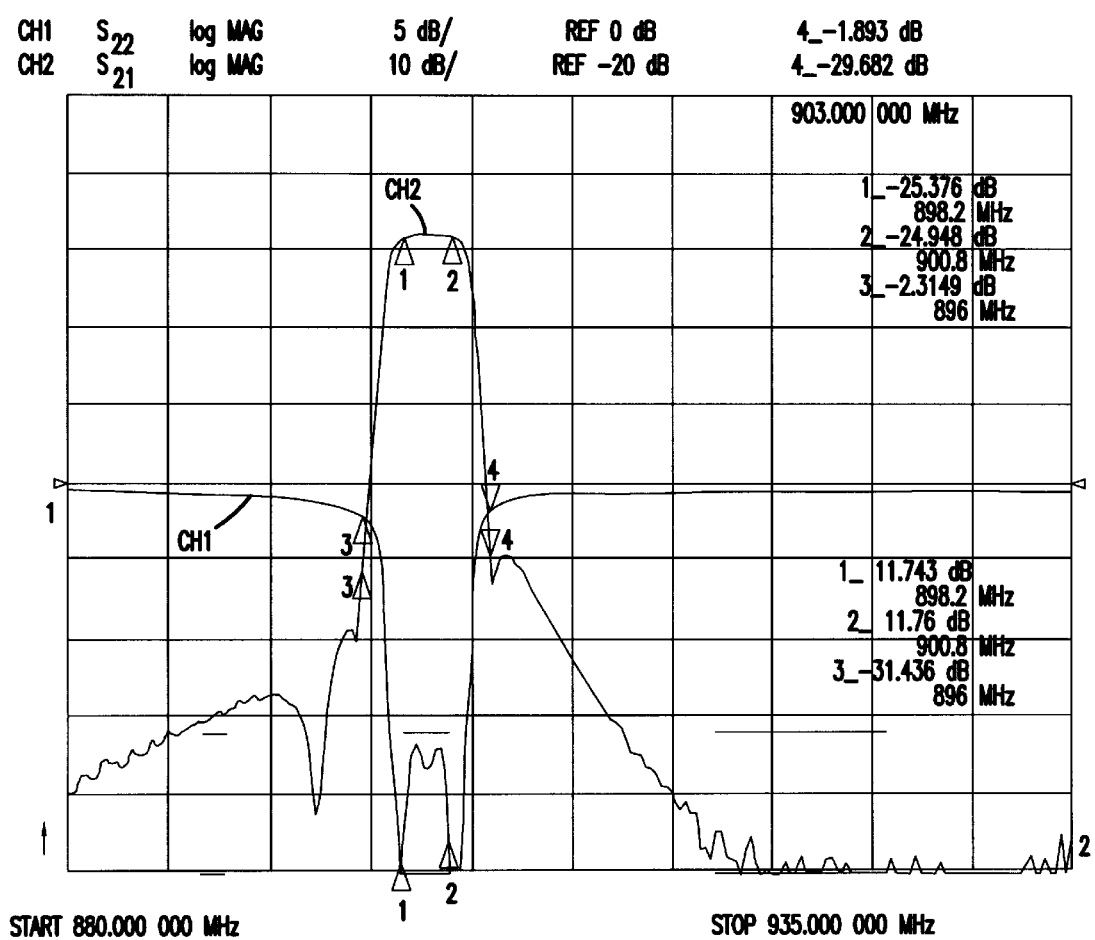
FIG. 3 is a graph that shows the overall frequency response of an example system constructed in accordance with the circuit of FIG. 2.

FIG. 3 is a graph that shows the overall frequency response of an example system constructed in accordance with the circuit of FIG. 2, where the low noise amplifier 102 has a gain of 16.0 dB. The curve CH1 indicates the output return loss of an example filter arrangement, and curve CH2 shows the frequency response of the filter arrangement. The curves span a frequency range from 880 MHz to 935 MHz. Thus, each horizontal increment designates 5.5 MHz. For the output return loss curve CH1, each vertical increment is 5 dB with a reference of 0 dB. For the frequency response, each vertical increment is 10 dB with a reference of −20 dB. As shown in the graph, the passband is from 898.2 MHz at 11.743 dB at marker 1 to 900.8 MHz at 11.76 dB at marker 2, with a gain of about 11.5 dB. The stopbands range from 880 MHz to 896 MHz and from 903 MHz to 935 MHz, with the attenuation at the stopband being greater than about 35.0 dB.

If, for example, two signals having individual power levels of −10.0 dBm at 896 MHz and 897 MHz are input to the system, one of the third order intermodulation products is at the frequency 898 MHz. The 898 MHz signal falls at the edge of the passband and the gain is 11.0 dB.

Figure 4:
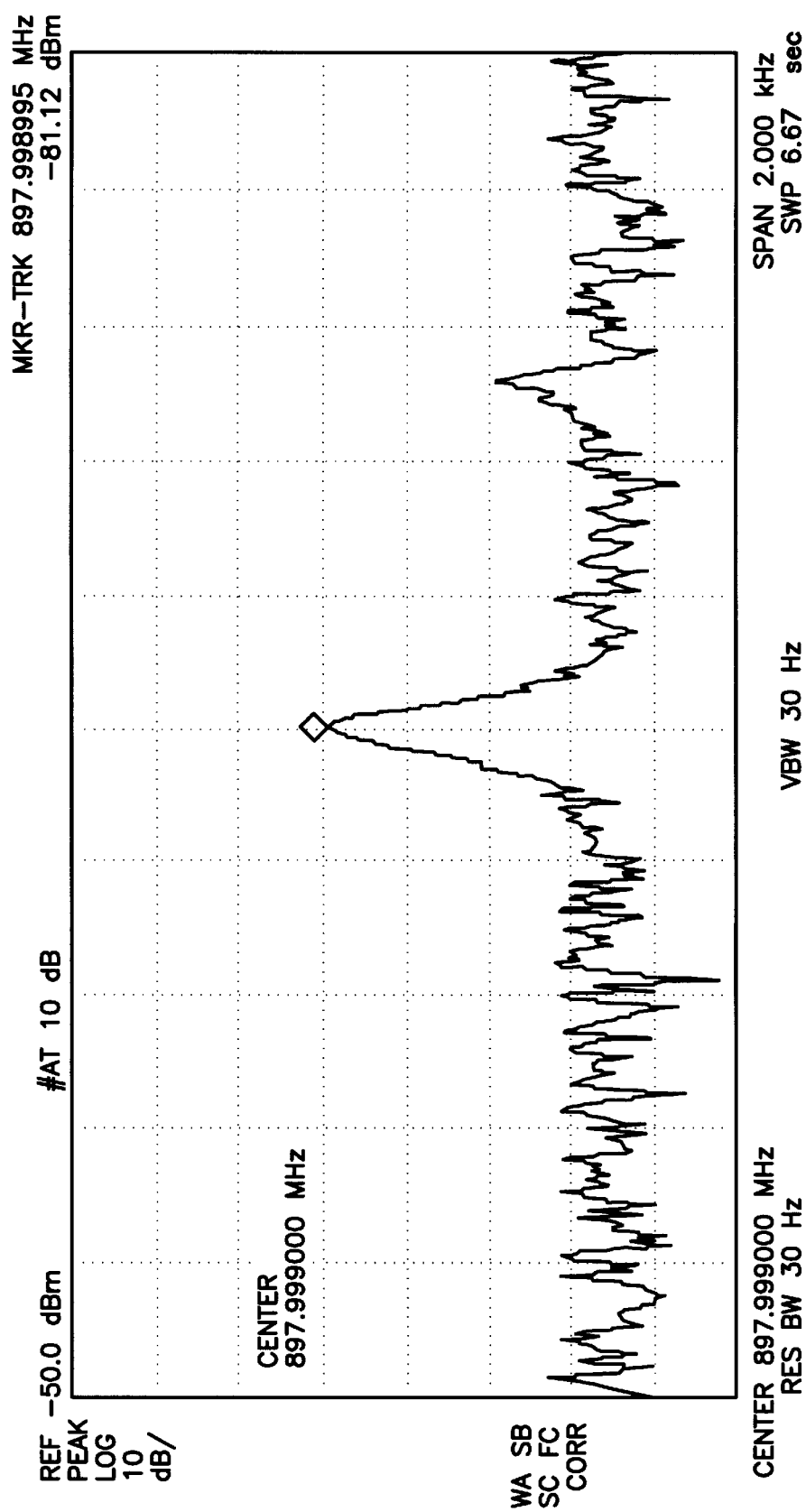
FIG. 4 is a graph that illustrates the output third order intermodulation level of an example system where a 180° electrical path is not used to couple the amplifier to the bandpass filter.
Figure 5:
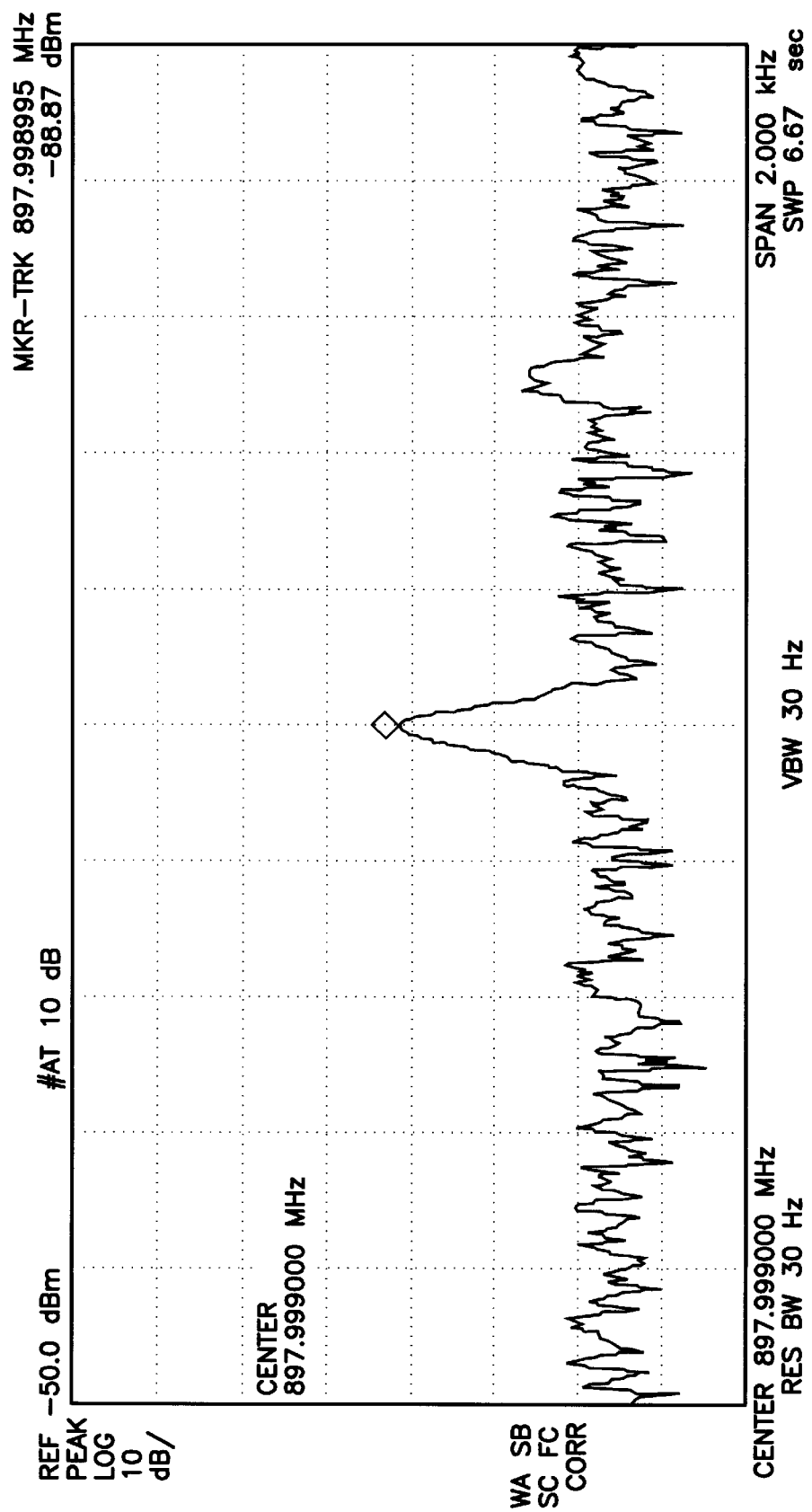
FIG. 5 is a graph that illustrates the output third order intermodulation level of the example system where a 180° electrical path is used to couple the amplifier to the bandpass filter.

Continuing the example, FIG. 4 is a graph that illustrates the output third order intermodulation level of an example system where a 180° electrical path is not used to couple the amplifier to the bandpass filter. For a 898 MHz signal (designated in the graphs as 897.998995 MHz), the third order intermodulation level is −81.0 dBm. In comparison and as shown in FIG. 5, when a 180° electrical path is used to couple the low noise amplifier 102 to bandpass filter 104, the level of the third order intermodulation signal is reduced to −89.0 dBm.

Accordingly, the present invention provides, among other aspects, a filtering arrangement and method providing a reduction and some cancellation in third order intermodulation. Other aspects and embodiments of the present invention will be apparent to those skilled in the art from consideration of the specification and practice of the invention disclosed herein. It is intended that the specification and illustrated embodiments be considered as exemplary only, with a true scope and spirit of the invention being indicated by the following claims.

We claim:

1. A circuit arrangement for reducing intermodulation, comprising:

a signal amplifier having an output port;

a bandpass filter having a passband ranging from a first frequency to a second frequency;

an electrical path constructed to couple the output port of the amplifier to the bandpass filter, and having a length that is an odd multiple of one-fourth a wavelength of a predetermined frequency in the passband.

2. The circuit arrangement of claim 1, wherein the predetermined frequency is approximately equal to one-half a sum of the first frequency and the second frequency.

3. The circuit arrangement of claim 2, wherein the amplifier is a low noise amplifier.

4. The circuit arrangement of claim 1, wherein the amplifier is a low noise amplifier.

5. The circuit arrangement of claim 1, wherein the electrical path is an electrically conductive cable.

6. The circuit arrangement of claim 1, wherein the electrical path is a metallic trace on a printed circuit board.

7. A radio signal receiver circuit arrangement, comprising:

an antenna;

a signal amplifier coupled to the antenna and having an output port;

a bandpass filter having a passband ranging from a first frequency to a second frequency;

an electrical path constructed to couple the output port of the amplifier to the bandpass filter, and having a length that is an odd multiple of one-fourth a wavelength of a predetermined frequency in the passband;

a voltage controlled oscillator;

a mixer coupled to the bandpass filter and to the voltage controlled oscillator, and arranged to provide an intermediate frequency; and an intermediate frequency amplifier coupled to the mixer.

8. A radio signal transceiver circuit arrangement, comprising:

an antenna;

a duplexer coupled to the antenna;

a first signal amplifier coupled to the antenna and having an output port;

a bandpass filter having a passband ranging from a first frequency to a second frequency;

an electrical path constructed to couple the output port of the first amplifier to the bandpass filter, and having a length that is an odd multiple of one-fourth a wavelength of a predetermined frequency in the passband;

a voltage controlled oscillator;

a mixer coupled to the bandpass filter and to the voltage controlled oscillator, and arranged to provide an intermediate frequency;

an intermediate frequency amplifier coupled to the mixer; and a transmit signal amplifier coupled to the duplexer and voltage controlled oscillator and arranged to provide amplified signals for transmission.

9. A method for reducing intermodulation in a filter circuit arrangement, comprising the steps of:

providing a signal amplifier;

providing a bandpass filter, the bandpass filter having a passband ranging from a first frequency to a second frequency; and establishing a signal path from the signal amplifier to the bandpass filter, the signal path having a length that is an odd multiple of one-fourth a wavelength of a predetermined frequency in the passband.

* * * * *